United States Patent
Mori et al.

[11] Patent Number: 5,416,592
[45] Date of Patent: May 16, 1995

[54] PROBE APPARATUS FOR MEASURING ELECTRICAL CHARACTERISTICS OF OBJECTS

[75] Inventors: Shigeoki Mori, Ayase; Keiichi Yokota, Nirasaki, both of Japan

[73] Assignee: Tokyo Electron Kabushiki Kaisha, Japan

[21] Appl. No.: 34,779

[22] Filed: Mar. 19, 1993

[30] Foreign Application Priority Data

Mar. 23, 1992 [JP] Japan ............................ 4-95908
Oct. 5, 1992 [JP] Japan ............................ 4-290787

[51] Int. Cl.⁶ .................. G01B 11/00; G01N 21/86
[52] U.S. Cl. ...................... 356/399; 356/400; 356/401; 250/548
[58] Field of Search ............ 356/399, 400, 401; 250/548; 324/158 F, 158 P

[56] References Cited

U.S. PATENT DOCUMENTS

| | | | |
|---|---|---|---|
| 4,748,477 | 5/1988 | Isohata et al. | 356/400 |
| 4,856,904 | 8/1989 | Akagawa | 250/548 |
| 4,899,921 | 2/1990 | Bendat et al. | 228/105 |
| 4,943,767 | 7/1990 | Yokota | 324/158 F |
| 4,985,676 | 1/1991 | Karasawa | 324/158 R |
| 5,044,072 | 9/1991 | Blais et al. | 356/400 |
| 5,130,554 | 7/1992 | Nose et al. | 356/400 |
| 5,264,918 | 11/1993 | Kagami | 356/400 |
| 5,274,575 | 12/1993 | Abe | 356/400 |

FOREIGN PATENT DOCUMENTS

| | | | |
|---|---|---|---|
| 2-28343 | 1/1990 | Japan | 356/400 |
| 2-28344 | 1/1990 | Japan | 356/400 |

*Primary Examiner*—Robert P. Limanek
*Assistant Examiner*—Minhloan Tran
*Attorney, Agent, or Firm*—Beveridge, DeGrandi, Weilacher & Young

[57] ABSTRACT

A contact ring having probe pins is mounted in the top surface of a casing, and a wafer holder table is placed below the contact ring. A holder member comprising a longitudinally extended cylindrical body are provided in such a manner as to be free to move into and out of a space between the probe pins and the wafer holder table, parallel to the upper surface of a wafer and along guide rails protruding from a casing. An image of the probe pins which act as contact means and an image of the electrode pads of an IC chip on the wafer are input to a camera that is provided in the holder member. With the probe apparatus of the present invention, it is possible to position the wafer while viewing these images, and there is no need to provide a region for separate positioning. This facilitates the design of a smaller probe apparatus.

14 Claims, 7 Drawing Sheets

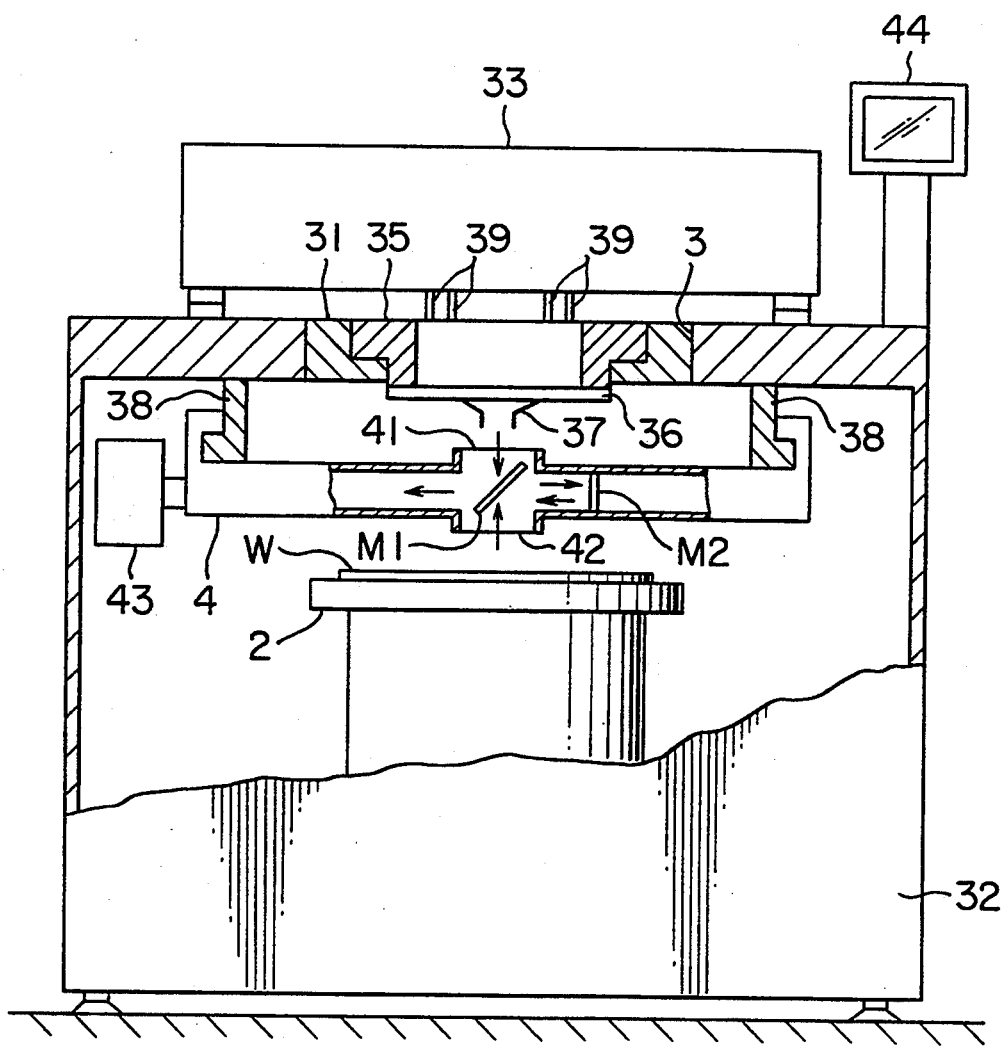
F I G. 1

LOW-MAGNIFICATION
MODE IMAGE

HIGH-MAGNIFICATION
MODE IMAGE

PROBE APPARATUS FOR MEASURING ELECTRICAL CHARACTERISTICS OF OBJECTS

BACKGROUND OF THE INVENTION

The present invention relates to a probe apparatus.

During the process of fabricating a semiconductor device, after IC chips have been completed on a semiconductor wafer, the wafer is divided into individual chips which are then packaged. At this point, a probe apparatus and tester are used to perform electrical measurements on each of the chips on the wafer, to identify and exclude defective chips before they are packaged.

With a conventional probe apparatus, as shown in FIGS. 12 and 13, a probe card 12 provided with probe pins 11 arrayed to correspond with the electrode pad array of an IC chip on the wafer is placed above a wafer holding table 1 that is movable in the X, Y, Z, and $\theta$ directions. After the wafer holding table 1 has been moved so that the probe pins 11 have been positioned (aligned) to match the electrode pads of the IC chip on the wafer, the probe pins 11 and the electrode pads are brought into contact, the electrode pads are then brought into electrical contact with a tester head 15 through the probe pins 11 and a contact ring 14 that includes components such as pogo pins 13, electrical measurements such as those using high frequencies to correspond to the usage speed of the IC chip are performed, and thus the electrical connections of the IC chip are determined to be good or not.

In order to perform accurate electrical measurements on the IC chip, the probe pins 11 must be brought into secure contact with the electrode pads, and, to enable this contact, the electrode pads of the IC chip on the wafer W must be accurately positioned with respect to the probe pins 11. Since there are large numbers of circuit components and wiring built into the tester head 15, it is extremely difficult to provide a TV camera therein and move the wafer holding table 1 below the probe pins 11 to position the electrode pads. Therefore an optical unit 17 is placed at a position 16 separated from the tester head 15, and the wafer is positioned below the optical unit 17 by moving the wafer holding table 1 in the X and Y directions, and the wafer W is positioned in the X, Y, and $\theta$ directions by adjusting the position of the wafer holding table 1 while looking at the electrode pads through the optical unit 17.

The above positioning is performed at four equidistant places around the periphery of the wafer W, as shown for example by the broken lines in FIG. 13, and thus a wide area is required as movement region for the positioning of the wafer holding table 1, within the regions shown by the broken lines. The tester head 15 is also big, so when the optical unit 17 that includes the TV camera is placed at a position separated from the tester head 15 and enough space for positioning below it is ensured, there is the problem that the probe apparatus becomes extremely big. And, since the movement stroke of the probe apparatus is large, there is the problem that highly accurate positioning is difficult.

SUMMARY OF THE INVENTION

The present invention was devised on the basis of the above situation and has as its objective the provision of a probe apparatus that enables a reduction in size of the apparatus body.

The present invention relates to a probe apparatus wherein a contact means is brought into contact with electrode pads on an object to be tested that is supported on an object holder table and wherein electrical measurements are performed on the object to be tested by a tester acting through the contact means. The probe apparatus is characterized in being provided with optical system components which are arranged in such a manner as to be free to move into and out of a space between the object holder table and the contact means and which transmit an image of the electrode pads of the object to be tested and an image of the contact means, and an image display means which displays the images transmitted from the optical system components for positioning purposes.

The present invention also relates to a further refinement of a probe apparatus wherein a contact means is brought into contact with electrode pads on an object to be tested that is supported on an object holder table and wherein electrical measurements are performed on the object to be tested by a tester acting through the contact means. The probe apparatus is characterized in being provided with optical system components which are arranged in such a manner as to be free to move into and out of a space between the object holder table and the contact means and which transmit an image of the electrode pads of the object to be tested and an image of the contact means, an image display means which displays the images transmitted from the optical system components for positioning purposes, a transparent contact surface formation body which has a contact surface on an upper side thereof, and an elevator means which raises and lowers the contact surface formation body with respect to the contact means. In this embodiment of the probe apparatus, the image of the contact means is transmitted by the optical system components in a state where the contact means is in contact with the contact surface of the contact surface formation body.

The present invention also relates to additions to the above probe apparatus, such as the provision of drive means for driving the optical system components parallel and perpendicular with respect to the surface to be tested of the object to be tested which is supported on the object holder table. A further addition is the provision of optical system components which comprise high-resolution optical system components and low-resolution optical system components. A still further addition is the provision of a memory portion for storing position data on the electrode pads of the object to be tested and on the tip portions of the contact means (the position data being detected by the optical system components) and a control means for controlling the position and angle with respect to a level plane, wherein a compound image of an image of the positions of tip portions of the contact means (as stored in the memory means) and an image of the electrode pads of the object to be tested (as detected by the optical system components) is displayed superimposed on the image display means.

In the probe apparatus according to the present invention the object to be tested is supported on the object holder table and is positioned below the contact means, the optical system components are inserted between the object holder table and the contact means, and images of the contact means and the electrode pads obtained by the optical system components are input to the image display means.

Subsequently, the optical system components are moved away from the object holder table, the contact means and the electrode pads are brought into contact with each other, and electrical measurements are performed. In this case, if the positioning is done with the contact means in contact with the surface of the contact surface formation body, this can be viewed as being the same as having the contact means in contact with the electrode pads, and thus positioning of a higher level of accuracy can be obtained.

The optical system components are driven in directions that are parallel (the X and Y directions) and perpendicular (the Z direction) with respect to the surface to be tested of the object to be tested which is supported on the object holder table, the plane positions of the electrode pads over the entire surface of the object to be tested and the positions of all the pin tips of the contact means are identified, the height of the optical system components above the pin tips of the contact means is also identified by bringing the pin tips into focus, and images of the electrode pads of the object to be tested and the contact means are input to the image display means.

In the probe apparatus of the present invention, an array pattern image of the entire contact means is first obtained by low-resolution optical system components, this image is transmitted together with an array pattern image of the electrode pads of the object to be tested in the corresponding region, the electrode pads and the contact means are positioned with respect to each other, then accurate positioning is obtained using images of the electrode pads and the contact means captured at high magnification by high-resolution optical system components. This method ensures rapid, highly reliable, and highly accurate positioning.

Highly automatic positioning can be done automatically and without human supervision by entrusting the relative positioning of the electrode pads and contact means to a control section. In this case, data covering the positions of all of the tips of the contact means is stored in the memory means, and corresponding test position data of the electrode pads of the object to be tested is corrected by compensation data for two optical axes of the optical system components, which is also stored in the memory means.

A position image of the tips of the contact means, stored in the memory section, is displayed graphically on the image display means, so that, by superimposing the electrode pad image of the object to be tested on top of this image, the operator can match the positions of the tips of the contact means with the electrode pads while looking at the two images.

BRIEF DESCRIPTION OF THE DRAWINGS

FIG. 1 is a partially cross-sectioned side view of an embodiment of the probe apparatus of the present invention.

DETAILED DESCRIPTION OF THE PREFERRED EMBODIMENTS

Figure 2:
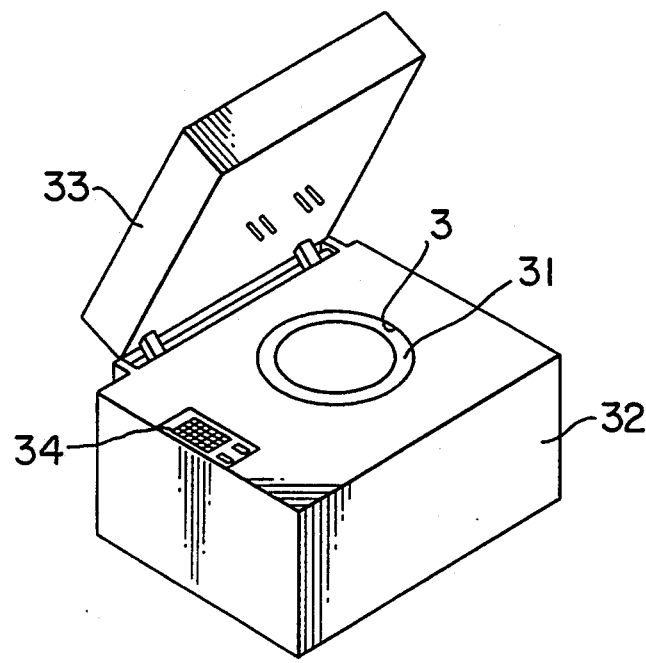
FIG. 2 is a perspective view of the exterior of the embodiment of the present invention.

An embodiment of the probe apparatus of the present invention is shown in cross-sectional side view in FIG. 1 and as an external perspective view in FIG. 2. As shown in FIGS. 1 and 2, a wafer holdng table 2 that can be moved in the X, Y, Z, and $\theta$ directions by a drive mechanism is positioned in the probe apparatus, and the probe apparatus is also provided with a casing 32 with a hole 3 in the upper surface thereof into which a insertion ring 31 is inserted, a tester head 33 which is free to open and close with respect to the casing 32 in such a manner as to be able to move away from the insertion ring 31 and which is connected by a cable to a tester, and a touch panel 34 that is provided in the front panel side of the casing 32 so as to enable control of the probe apparatus.

A contact ring 35 that has in a lower surface thereof a probe card 36 is fitted and mounted into the insertion ring 31. A plurality of probe pins 37 that act as contact means extend from the lower surface of the probe card 36 in such a manner as to extend diagonally downward toward the center of the probe card 36.

Figure 3:
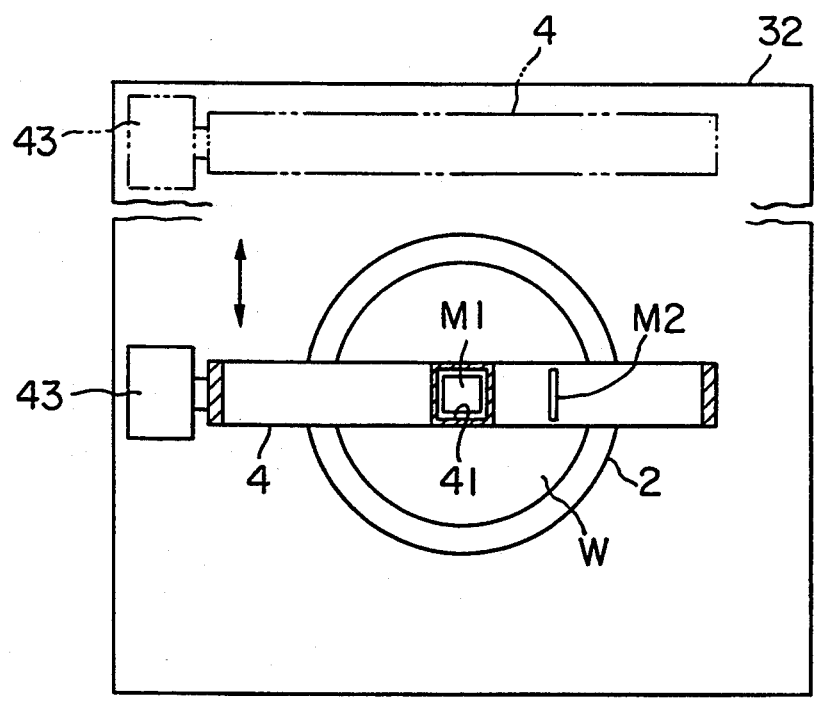
FIG. 3 is a plan view of essential parts of the embodiment of the present invention.

A cylindrical holder member 4 provided with opening portions 41 and 42 in upper and lower surfaces in the center thereof is mounted in a space between the wafer holding table 2 and the probe pins 37, in such a manner that it is free to move in and out parallel to the upper surface of a wafer W, as shown in FIGS. 1 and 3. The holder member 4 is configured in such a manner that two sides thereof are guided by two guide rails 38 suspended from the inner side of the upper surface of the casing 32, and it can move between a position below the probe pins 37 and a corner portion of the casing 32 separated from a region in which the wafer holding table 2 is raised. The holder member 4 is also free to move in fine increments in the X, Y, and Z directions, by an incremental adjustment means that is not shown in the figures.

In the side end portion of the holder member 4 is mounted an image display means for positioning, such as a camera 43, that is capable of switching between a low-magnification display mode and a high-magnification display mode, for instance, in such a manner that an optical axis thereof is formed in the longitudinal direction within the holder member 4. A half mirror M1 that can reflect an image of the probe pins 37 inserted through the opening portion 41, and transmit it to the camera 43, is provided in the center of the holder member 4.

A full mirror M2 is also placed in the interior of the holder member 4 on the opposite side of the camera 43 from the half mirror M1, and on the optical axis of the camera 43. After an image of the surface of the wafer W on the wafer holding table 2 has been reflected toward the full mirror M2 by the half mirror M1 through the opening portion 42, the full mirror M2 has the role of reflecting the image back toward the half mirror M1. In this embodiment, the optical system components comprise the half mirror M1 and the full mirror M2.

Figure 4A:
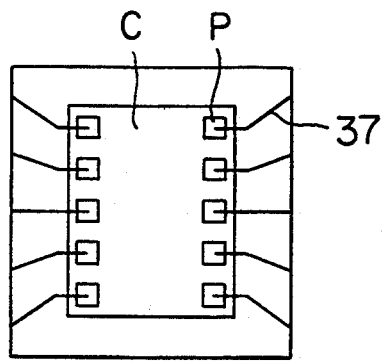
FIGS. 4A and 4B are views illustrating the situation of the electrode pads and the probe pins.
Figure 4B:
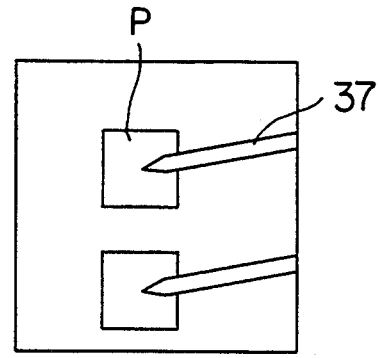

The operation of the above embodiment will now be described. First, the semiconductor wafer W on which is formed a large number of IC chips in a matrix, and which is the object to be tested, is held on the wafer holding table 2, and the wafer holding table 2 is moved in the X and Y directions to position it directly under the probe card 36. The holder member 4 is then moved along the two guide rails 38 until it is positioned between the probe pins 37 and the wafer W, and thus the image of the probe pins 37 is transmitted through the half mirror M1 to the camera 43, as shown by the solid arrows in FIG. 1. The image of the surface of the semiconductor wafer W is transmitted along the path from the half mirror M1, to the full mirror M2, then back through the half mirror M1 into the camera 43. In this way, images of, for example, all the probe pins 37 and all the pads P of the IC chip on the wafer W can be displayed by putting the camera 43 into a low-magnification mode, as shown in FIG. 4A. Alternatively, enlarged images of, for example, probe pins 37 with tips of about 5 to 8 $\mu$m and electrode pads P of sides of about 80 to 100 $\mu$m can be displayed by using a high-magnification mode, as shown in FIG. 4B. Looking at the probe pins 37 in contact with the pads P of the IC chip on the wafer W directly through the camera in this way has the advantage that, after the probe pins 37 first come into contact with the pads P, if overdrive has occurred such that the pins have ruptured the film formed on the wafer W and thus there is some mispositioning until they come into contact with the pads, it is possible to ensure that the tips of the probe pins reach a final contact position.

While looking at this display on a CRT display 44, the operator can position (align) the electrode pads P on the IC chip with respect to the probe pins 37. In other words, he can use a drive mechanism to move the wafer W in the X and Y directions until the tips of the probe pins 37 are positioned within prescribed areas of the electrode pads P. Next, the holder member 4 is moved away from the position directly under the probe card 36 along the guide rails 38 to a corner portion of the casing 32 (a position separated from the region in which the wafer holding table 2 rises and lowers), either by hand or by the use of a drive mechanism. The wafer holding table 2 is then raised further by the drive mechanism, until the probe pins 37 and the electrode pads P come into contact with each other, and also the tester head 33 is brought into contact through pogo pins 39 in the contact ring 35, so that electrical measurements can be performed to determine the quality of the electrical contacts of the IC chips. Note that if wafers W of approximately the same type are to be tested, the electrical measurements can be performed with the tester head 33 still in contact through the pogo pins 39 of the contact ring 35.

In the embodiment configured as described above, since the wafer W can be positioned while the wafer W is in place in the measurement region immediately below the probe card 36, there is no need to provide a separate secure place for use in positioning at some distance from the measurement region, so the probe apparatus can be made smaller. In addition, positioning in a place separate from the measurement region necessitate a high level of accuracy concerning the linearity and direction of the rails of the drive mechanism, but the above embodiment removes the need for considering these points, which is advantageous from the viewpoint of the design of the mechanism.

With the present invention, since the positions of the wafer W and the probe pins 37 are detected simultaneously by the same optical system components, there is no need to ensure individual stopping position accuracies of the holder member 4.

Figure 5:
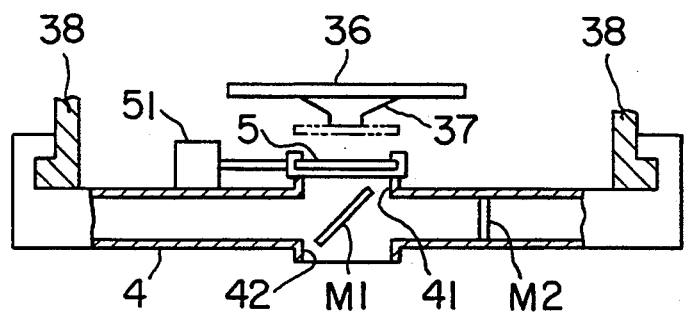
FIG. 5 is a partially cross-sectioned side view of essential parts of a second embodiment of the present invention.

As shown in FIG. 5, a glass plate 5 with a contact surface formation body of a sufficiently large area to cover the pin region of the probe pins 37 on the optical axis on the upper surface of the center of the holder member 4 could be provided on the holder member 4 and arranged so as to by a freely elevatable in the Z direction by an elevator mechanism. With this configuration, if the glass plate 5 is raised by an elevator mechanism 51 in such a manner that the probe pins 37 are pushed into contact with the surface (the contact surface formation body) of the glass plate 5, as shown by the broken lines, and if the wafer W should be overdriven with respect to the probe pins 37 (if the wafer W is raised a little to far after it has come into contact with the probe pins 37), the tips of the curved probe pins 37 will slide sideways along the surface to achieve the same effect. Therefore, this can enable an even more accurate level of positioning. Note that there's no need to use the elevator mechanism 51 to elevate the glass plate 5—the holder member 4 could be elevated instead.

Figure 6:
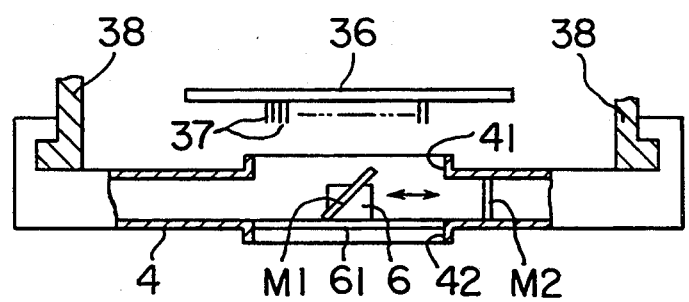
FIG. 6 is a partially cross-sectioned side view of a third embodiment of the present invention.

Instead of using the probe apparatus of the present invention to measure each of the IC chips individually, it can also be adapted to measure a number of IC chips, such as ten of them, at a time. In this case, the opening portions 41 and 42 are formed of an area large enough to accommodate the pin region of the probe pins 37, and the half mirror M1 could be provided on the holder member 4 and moved by a movement mechanism 6 in such a manner that the half mirror M1 can be moved horizontally (in the direction of the arrows) along separately provided rails 61 within a region corresponding to the pin region, as shown by way of example in FIG. 6.

As another embodiment of the present invention that can measure several IC chips at the same time, such as ten, a method is used in which, after an image display means 43 such as a low-magnification TV camera or CCD camera is used to form an image of the entire pin area of the probe pins 37 reflected in the half mirror M1, an image display means 43 such as a high-magnification TV camera or CCD camera is substituted to form an image of a prescribed portion within the pin region, such as a first set of probe pins, and thus images can be obtained without moving the half mirror M1.

It should be obvious to those skilled in the art that the image display means is not limited to a camera—it could be a microscope, for instance. Similarly, the image display means need not be mounted on the holder member 4; it could be mounted on a side of the casing 32.

Again, the configurations of the mirror positions and the optical paths are not limited to those of the embodiments described above—the mirrors could be omitted and alternative image display means such as two optical fibers could be used instead to obtain images of the probe pins and the surface of the wafer.

The holder member that supports the optical system components is described in the embodiments above as moving linearly along guide rails, but it could also be moved upward under the probe card by pivoting about one edge of the holder member, or it could be moved away therefrom.

Figure 7:
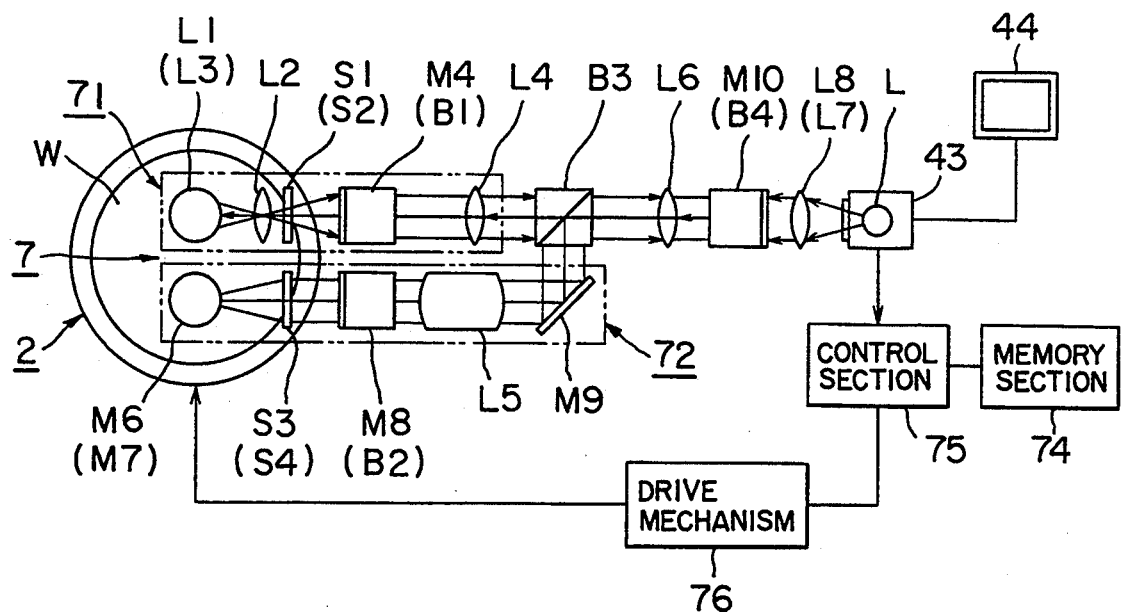
FIG. 7 is a view used for illustrating a description of the optical system components of a fourth embodiment of the present invention, and the configuration of the structure relating to the optical system components.
Figure 8:
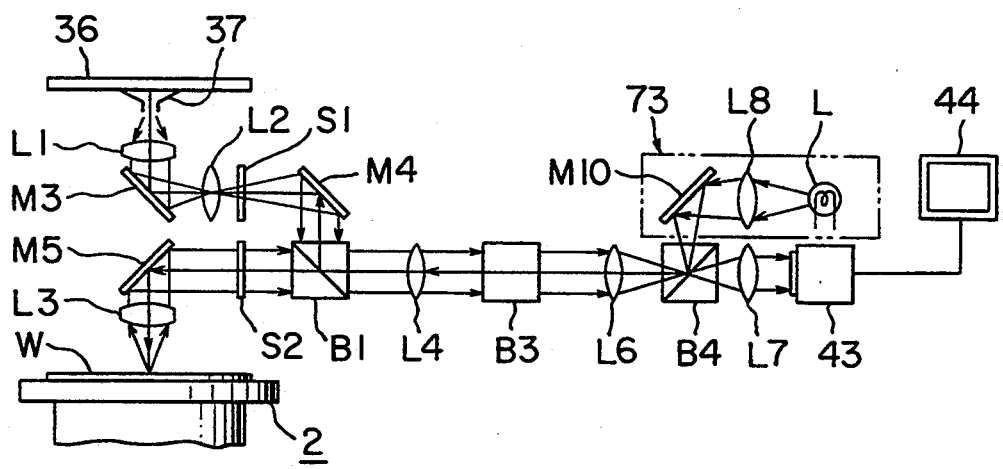
FIG. 8 is a side view of optical system components for high resolution in the optical system components shown in FIG. 7.
Figure 9:
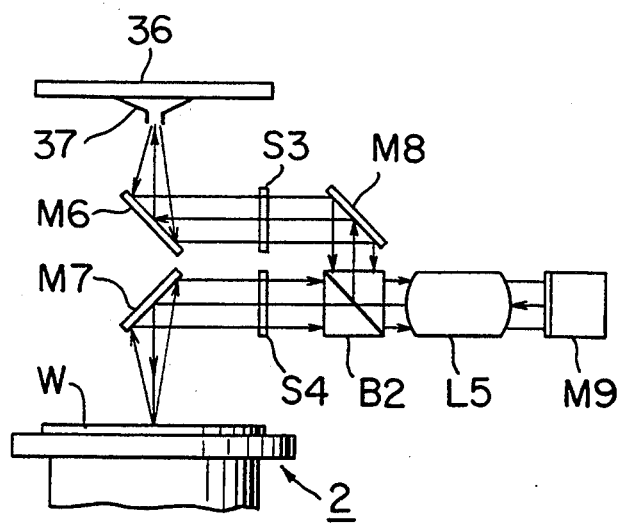
FIG. 9 is a side view of optical system components for low resolution in the optical system components shown in FIG. 7.
Figure 10:
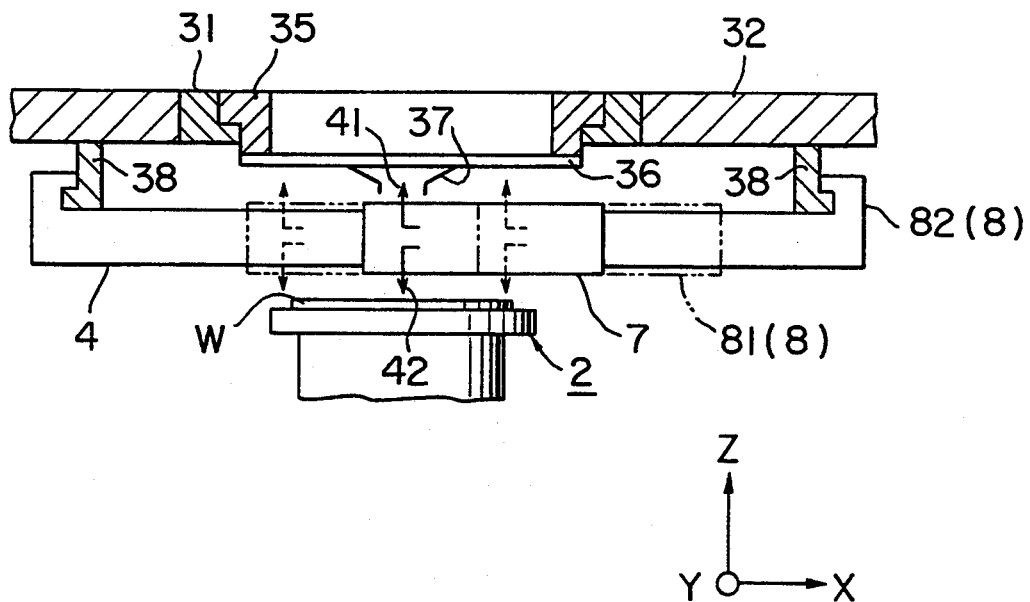
FIG. 10 is a partially cross-sectioned view of one example of the drive means of the optical system components shown in FIG. 7.

A fourth embodiment of the probe apparatus of the present invention will now be described. FIGS. 7 to 10 are drawings illustrative of another embodiment of the contact means which is inserted between the probe pins and the object to be tested (and which was described in the embodiments above as optical system components merely by way of example) and the configuration of the structure relating to the optical system components. FIG. 7 is a view from above (from the probe pin side), FIGS. 8 and 9 are each views from the side, and FIG. 10 shows drive means. As shown in FIG. 7, the probe apparatus of this embodiment is provided with optical system components 7 that transmit images of the electrode pads of the object to be tested and the probe pins, a camera 43 and CRT display 44 that together comprise an image display means that displays the images transmitted by the optical system components 7, a memory section 74 for storing position data relating to the electrode pads of the wafer W and the probe pins 37 displayed on the CRT display 44, and a control section 75 that controls the relative positions of the electrode pads with respect to the probe pins 37, based on the data stored in the memory section 74. The optical system components 7 are provided with a drive means 8 that drives them in directions parallel and perpendicular to the wafer W, as shown in FIG. 10.

The optical system components 7 comprise high-resolution optical system components 71 and low-resolution optical system components 72 aligned side-by-side. The configuration of the high-resolution optical system components 71 is such that a linear sequence of a lens L1, a full mirror M3, a lens L2, a shutter S1, and a full mirror M4 that form a path for an image of the probe pins 37 is provided in an upper part thereof, and a linear sequence of a lens L3, a full mirror M5, and a shutter S2 that form a path for an image of the wafer W is provided in a lower part thereof, as shown in FIG. 8. Downstream of the optical path of the shutter S2 is provided a linear sequence of a beam splitter B1 and a lens L4 that form a common optical path for the images of the electrode pads and the wafer W.

The configuration of the low-resolution optical system components 72 is such that a linear sequence of a full mirror M6, a shutter S3, and a full mirror M8 that form a path for an image of the probe pins 37 is provided in an upper part thereof, and a linear sequence of a full mirror M7 and a shutter S4 that form a path for an image of the wafer W is provided in a lower part thereof, as shown in FIG. 9. Downstream of the optical path of the shutter S4 is provided a linear sequence of a beam splitter B2, a lens L5, and a full mirror M9 that form a common optical path for the images of the electrode pads and the wafer W.

As shown in FIG. 8, downstream of the optical paths of the lens L4 of the high-resolution optical system components 71 and the full mirror M9 of the low-resolution optical system components 72 is provided a beam splitter B3, a lens L6, a beam splitter B4, and a lens L7 that form a common optical path for the images transmitted by the high-resolution optical system components 71 and the low-resolution optical system components 72. A light source section 73 configured of, for example, a lamp L, a lens L8, and a full mirror M10 is provided above the beam splitter B4. In other words, the optical system components 7 of this embodiment comprise the high-resolution optical system components 71, the low-resolution optical system components 72, the beam splitter B3, the lens L6, the beam splitter B4, the lens L7, and the light source section 73.

The resolution of the low-resolution optical system components 72 is set in such a manner that an image of all the probe pins 37 and an image of the region on the object to be tested corresponding to all the probe pins 37 can be displayed on display means 43 and 44, which will be described below. Similarly, the resolution of the high-resolution optical system components 71 is set in such a manner that an image of some of the probe pins 37 (for example, one pin or a few pins) and an image of the region on the object to be tested corresponding to these probe pins 37 can be viewed enlarged thereby.

In both the high-resolution optical system components 71 and the low-resolution optical system components 72, the optical system that transmits the pattern image on the wafer W and the optical system that transmits the image of the tips of the probe pins 37 are set up in such a manner that the positions of the optical X and Y directions thereof match, and also the imaging directions (the $\theta$ directions) thereof match.

The camera 43 is placed downstream of the optical path of the lens L7. In this embodiment, a CRT display 44 is provided to enable the operator to view the images captured by the camera 43. Since this embodiment is also provided with a memory section 74 for storing digitized image data, the image data detected by the camera 43 can be processed by a control section 75 and stored in the memory section 74. The results of decision processing done by the control section 75 can also be used to drive the wafer holder table in the X, Y, Z, and $\theta$ directions.

As shown in FIG. 10, the drive means 8 is configured of a drive motor that is not shown in the figure, an X-direction drive mechanism 81 and a Y-direction drive mechanism 82, each comprising a ball-and-screw mechanism, and a Z-direction drive mechanism that is also not shown in the figure. The optical system components 7 are driven for about 100 mm or more in the X-axis direction by the X-direction drive mechanism 81 along guide rails (not shown in the figure) mounted in the holder member 4, and for about ±50 mm in the Y-axis direction by the Y-direction drive mechanism 82 along the guide rails 38, centered on the probe pins 37. The optical system components 7 are moved out of the way to a home position in a corner part of the casing 32, in the same way as in the embodiment shown in FIG. 1.

Position data on the electrode pads of the IC chip and the probe pins 37 (in other words, an array pattern image of all the probe pins 37, an enlarged image of the probe pins 37, an image of the entire IC chip, and an enlarged image of the electrode pads of the IC chip), which is transmitted to the camera 43 through the high-resolution optical system components 71 and low-resolution optical system components 72 of the optical system components 7, is stored as image data in the memory section 74.

The control section 75 has the function of giving control signals to a drive mechanism 76 of the wafer holding table 2 to control the relative position of the electrode pads with respect to the probe pins 37, based on position data on the electrode pads of the IC chip and the probe pins 37 that is stored in the memory section 74.

The operation of the above embodiment of the probe apparatus of the present invention will now be described. First, the full mirror M6 of the low-resolution optical system components 72 of the optical system components 7 is positioned below the probe pins 37 by the drive means 8, the shutter S3 is placed in an open state, and the shutter S4 is placed in a closed state. When the lamp L of the light source section 73 is turned on, an array pattern image of all the probe pins 37 is transmitted along the path of the full mirror M6, the shutter S3, the full mirror M8, the beam splitter B2, the lens L5, the full mirror M9, the beam splitter B3, the lens L6, the beam splitter B4, and the lens L7, whereupon it is detected by the camera 43. Prescribed pins are identified from amongst the probe pins 37, and the high-resolution optical system components 71 are used as described below to reliably detect the positions of these prescribed pins.

The lens L1 of the high-resolution optical system components 71 of the optical system components 7 is then positioned below the probe pins 37 by the drive means 8, the shutter S1 is placed in an open state, the shutter S2 is placed in a closed state, and the tips of the prescribed probe pins 37 are set at the focus of the lens L1. Thus an enlarged image of the probe pins 37 is transmitted along the path of the lens L1, the full mirror M3, the lens L2, the shutter S1, the full mirror M4, the beam splitter B1, the lens L4, the beam splitter B3, the lens L6, the beam splitter B4, and the lens L7, whereupon it is detected by the camera 43, and image data of the prescribed pins of the probe pins 37 is stored in the memory section 74.

Next, the shutter S3 on the probe pins 37 side is closed and the shutter S4 on the wafer side is opened, so that an image of the surface of the wafer W (an image of the entire surface or the IC chip, or, in other words, an array pattern image of the electrode pads) which is transmitted along the path of the full mirror M7, the shutter S4, the beam splitter B2, the lens L5, the full mirror M9, the beam splitter B3, the lens L6, the beam splitter B4, and the lens L7, whereupon it is detected by the camera 43, to identify the prescribed pads corresponding to the prescribed pins from the low-resolution image of the surface of the wafer W.

The lens L3 of the high-resolution optical system components 71 of the optical system components 7 is then positioned above part of the wafer W corresponding to the prescribed probe pins 37, the shutter S1 on the probe pins 37 side is closed, the shutter S2 on the wafer W side is opened, and the surface of the wafer W is set at the focus of the lens L3. Thus an enlarged image of the prescribed electrode pads of the wafer W, which is transmitted along the path of the lens L3, the full mirror M5, the shutter S2, the beam splitter B1, the lens L4, the beam splitter B3, the lens L6, the beam splitter B4, and the lens L7 is both displayed on the CRT display 44 through the camera 43 and stored in the memory section 74 as image data.

Control signals are then sent to the drive mechanism 76 of the wafer holding table 2 to drive the wafer holding table 2 in the $\theta$ direction in such a manner that the array direction of the probe pins 37 matches that of the electrode pads, based on the array pattern image data of the electrode pads of the wafer W and the array pattern image data of the probe pins 37 obtained as described above.

Control signals are also sent to the drive mechanism 76 of the wafer holding table 2 to drive the wafer holding table 2 in the X and Y directions in such a manner that the positions of the tips of the probe pins 37 match those of the electrode pads, based on the image data of the electrode pads of the wafer W and the image data of the tips of the probe pins 37 obtained as described above.

At this point, focusing of the optical system components 7 with respect to the tips of the probe pins 37 and the surface of the wafer W is such that the height of the optical system components 7 is automatically set by detecting the brightness of the image of the tips of the probe pins 37 as captured by the camera 43, and the Z direction position of the drive mechanism of the wafer holding table 2 is controlled by detecting the brightness of the pattern image on the surface of the wafer W as captured by the camera 43.

Alternatively, the height of the optical system components 7 could be set by previously determining the height at which focusing is achieved and using a mechanical detection means that stops the optical system components 7 at that position.

If a mechanical detection means is used, the configuration could be such that, for example, a conductive plate is mounted in the optical system components 7, the optical system components 7 are raised by a Z-direction drive mechanism 83 until it is confirmed that the tips of the probe pins 37 have come into contact with the conductive plate, and thus the raising of the optical system components 7 is stopped. In this case, the position at which the conductive plate is mounted is set to be the position at which focusing of the tips of the probe pins 37 is achieved when the probe pins 37 are in contact with the conductive plate. The method of identifying that the conductive plate and pin tips are in contact could be a contact check method by which contact-check data is detected by the tester, or a needle sensor method by which a drop to ground is detected at contact with prescribed pins of the probe card that are left open, or a touch-sensor method which detects a huge amplification at contact in a high-frequency signal applied to prescribed pins of the probe card. If focusing is with respect to the surface of the wafer, setting could be done by using a component such as a large-capacity gap sensor, wherein a signal from this sensor controls the Z-direction drive mechanism of the drive means 8 or the X, Y, Z, and $\theta$ direction drive mechanism 76 of the wafer holding table 2 and thus the optical system components 7 are focused.

In this embodiment, if there is any offset in the optical axes of the lens L1/mirror M3 and the lens L3/mirror M5 combinations, or in the optical axes of the full mirrors M6 and M7 of the low-resolution optical system components 72, this optical axis offset must be detected and stored in the memory section 74 before testing starts, and the drive mechanism 76 of the wafer holding table 2 must be driven by the control section 75 after taking the magnitude of this optical axis offset into consideration, to enable the positioning of the probe pins 37 and the electrode pads in the X and Y directions. Similarly, if there is any offset in the imaging directions of the pin tip side or the wafer side in either the high-resolution optical system components 71 or the low-resolution optical system components 72, the magnitude of the offset must be stored in the memory section 74 before testing starts, and the amount of offset in the imaging direction must be compensated for when focusing is done in the $\theta$ direction.

Figure 11A:
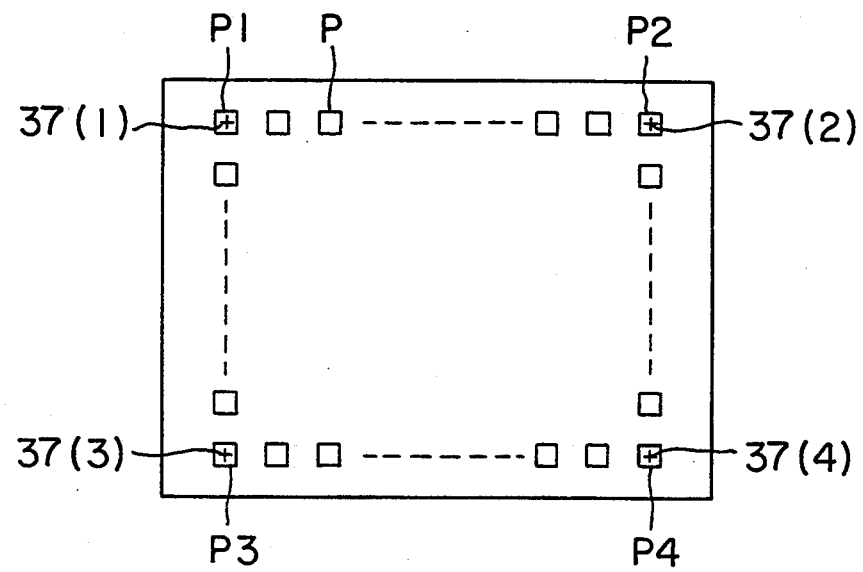
FIGS. 11A and 11B are views used for illustrating a description of the positioning of the electrode pads and the probe pins, as shown on a CRT display.
Figure 11B:
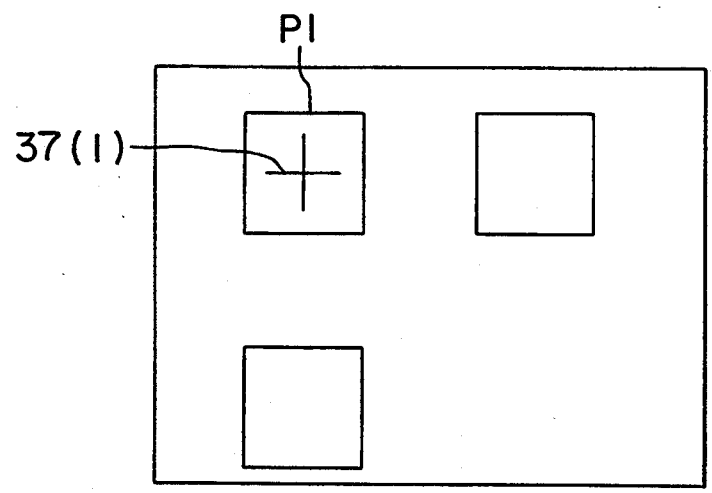
Figure 12:
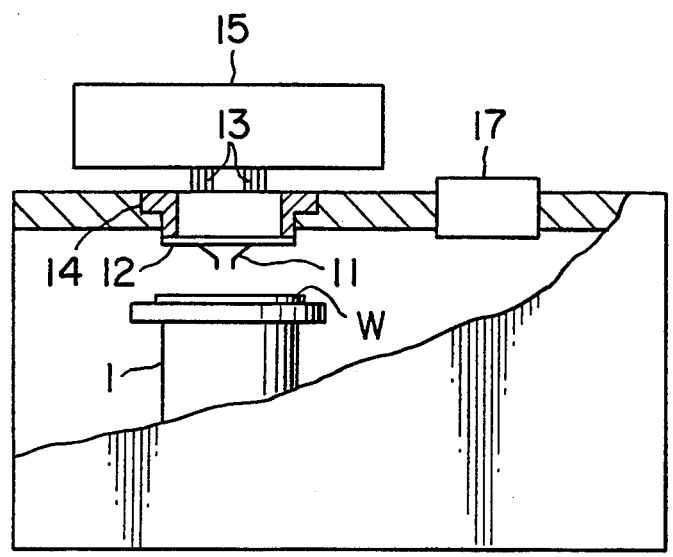
FIG. 12 is a partially cross-sectioned side view of a conventional probe apparatus.
Figure 13:
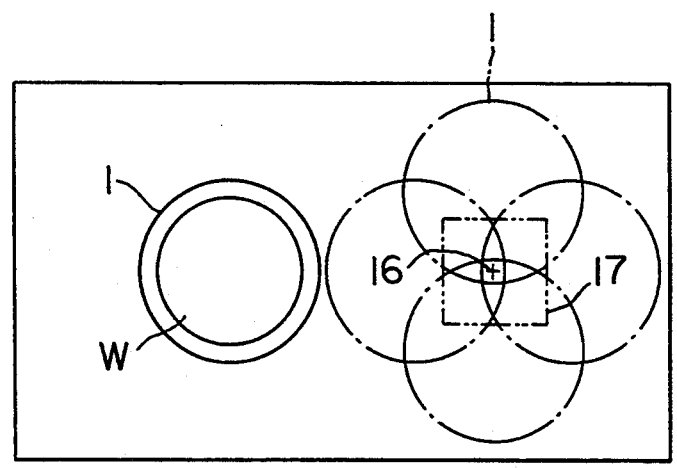
FIG. 13 is an abbreviated plan view of the conventional probe apparatus.

Position images of the electrode pads and the probe pins displayed on the CRT display 44 during this time are as shown in FIGS. 11A and 11B. The image obtained by the low-resolution optical system components 72 is shown in FIG. 11A and that obtained by the high-resolution optical system components 71 is shown in FIG. 11B, where $P_1$ to $P_4$ denote prescribed pads and 37(1) to 37(4) denote prescribed pins. Note that the positions of the prescribed pins are simply marked with crosses, to identify them as memory data.

The above offsets in the optical axes or imaging directions could be stored in the memory section 74 by, for example, using the image display means to capture the images of reference marks printed at positions corresponding to those on the probe card 36 and the wafer holding table 2, for example.

With this embodiment of the present invention, since position data on the probe pins 37 and the electrode pads P displayed on the camera 43 is stored in the memory section 74 and relative positioning of the probe pins 37 and the electrode pads P is done on. the basis of this stored data, highly accurate positioning can be achieved automatically.

Note that the low-resolution optical system components 72 of this embodiment are not provided with any objective lenses, but the above means of focusing can still be used even if the low-resolution optical system components 72 are provided with objective lenses.

With this embodiment of the present invention, if both the shutter S1 and shutter S2 of the low-resolution optical system components 72 are open, the array pattern image of all the probe pins 37 and the image of the surface of the wafer W are displayed on the CRT display via the camera 43. Similarly, if both the shutter S3 and the shutter S4 of the high-resolution optical system components 71 are open, the image of the tips of the probe pins 37 and the image of the electrode pads of the wafer W are displayed on the CRT display via the camera 43. Therefore, the operator can operate the wafer holding table 2 to mutually position the probe pins 37 and the electrode pads while viewing these images.

However, in this case, the lenses L1 and L3 of the high-resolution optical system components 71 must be adjusted physically and accurately to compensate for the offset in optical axes.

Note that the contact means of the present invention is not limited to probe pins—it could comprise contact elements made of conductive rubber, for example. Similarly, the object to be tested is not limited to a wafer W for IC chips—it could be an LCD substrate.

What is claimed is:

1. A probe apparatus wherein a probe means is brought into contact with electrode pads of an object to be tested that is supported on an object holder table and wherein electrical measurements are performed on said object to be tested by a tester acting through said probe means, said probe apparatus comprising:
   optical means positionable into and out of a space between said object holder table and said probe means and capable of movement parallel to an upper surface of said object to be tested, for transmitting an image of said electrode pads of said object to be tested and an image of said probe means; and
   an image display means for displaying said images transmitted by said optical means.

2. The probe apparatus according to claim 1, further comprising a drive means for driving said optical means in parallel and perpendicular directions with respect to a surface to be tested of said object supported on said holder table.

3. The probe apparatus according to claim 1, wherein said optical means includes high-resolution optical means and low-resolution optical means.

4. The probe apparatus according to claim 1, further comprising
   a memory means for storing position data on said electrode pads of said object to be tested and tip portions of said probe means, said position data being detected by said optical means; and
   a control means for controlling position and angle with respect to a level plane, in order to perform mutual positioning between said electrode pads of said object to be tested and said probe means, based on data stored in said memory means.

5. The probe apparatus according to claim 4, wherein an image of the positions of tip portions of said probe means as stored in said memory means and an image of said electrode pads as detected by said optical means are displayed as superimposed on said image display means.

6. The probe apparatus according to claim 1, wherein said object holder table is provided with fine adjustment means for enabling free movement thereof in the X, Y, Z, and $\theta$ directions.

7. A probe apparatus wherein a probe means is brought into contact with electrode pads of an object to be tested that is supported on an object holder table and wherein electrical measurements are performed on said object to be tested by a tester acting through said probe means, said probe apparatus comprising:
   optical means positionable into and out of a space between said object holder table and said probe means and capable of movement parallel to an upper surface of said object to be tested, for transmitting an image of said electrode pads of said object to be tested and an image of said probe means; and
   an image display means which displays said images transmitted from said optical means;
   a transparent body having a contact surface on an upper side thereof, said transparent body being positionable between said optical means and said probe means; and
   an elevator means for raising and lowering said transparent body with respect to said probe means;
   wherein said image of said probe means is transmitted by said optical means in a state where said probe means is in contact with said contact surface of said transparent body.

8. The probe apparatus according to claim 7, further comprising a drive means for driving said optical means in parallel and perpendicular directions with respect to a surface to be tested of said object to be tested which object is supported on said holder table.

9. The probe apparatus according to claim 7, wherein said optical means includes high-resolution optical means and low-resolution optical means.

10. The probe apparatus according to claim 7, further comprising a memory means for storing position data of said electrode pads and of tip portions of said probe means, said position data being detected by said optical means; and a control means for controlling position and angle with respect to a level plane, in order to perform mutual positioning between said electrode pads and said probe means, based on data stored in said memory means.

11. The probe apparatus according to claim 10, wherein an image of the positions of tip portions of said probe means as stored in said memory means and an image of said electrode pads as detected by said optical means are displayed as superimposed on said image display means.

12. The probe apparatus according to claim 7, wherein said object holder table is provided with fine adjustment means for enabling free movement thereof in the X, Y, Z, and θ directions.

13. A probe apparatus wherein a probe means is brought into contact with electrode pads on an object to be tested that is supported on an object holder table and wherein electrical measurements are performed by a tester acting through said probe means, said probe apparatus comprising:

optical means positionable into and out of a space between said object holder table and said probe means, and in parallel to an upper surface of said object to be tested, for transmitting an image of said electrode pads and an image of said probe means; and alignment means for positioning said electrode pads of said object supported on said object holder table in alignment with said probe means, based on information of images transmitted from said optical means; and image display means for displaying said images transmitted from said optical means.

14. The probe apparatus according to claim 13, wherein said alignment means includes moving means for moving said object holder table in the X, Y, Z, and θ directions.

* * * * *